(12) United States Patent
Yamaoka et al.

(10) Patent No.: US 8,256,258 B2
(45) Date of Patent: Sep. 4, 2012

(54) RADIATOR, HEAT SINK FAN, AND RADIATOR MANUFACTURING METHOD

(75) Inventors: Naoto Yamaoka, Kyoto (JP); Takamasa Yamashita, Kyoto (JP)

(73) Assignee: Nidec Corporation, Kyoto (JP)

( * ) Notice: Subject to any disclaimer, the term of this patent is extended or adjusted under 35 U.S.C. 154(b) by 1265 days.

(21) Appl. No.: 12/014,108

(22) Filed: Jan. 15, 2008

(65) Prior Publication Data

US 2008/0180912 A1 Jul. 31, 2008

(30) Foreign Application Priority Data

Jan. 15, 2007 (JP) ................................. 2007-005490
Mar. 27, 2007 (JP) ................................. 2007-083091

(51) Int. Cl.
*B21C 23/00* (2006.01)
*B21C 35/00* (2006.01)
*B21C 23/04* (2006.01)
*B21C 53/00* (2006.01)
*B21D 53/06* (2006.01)

(52) U.S. Cl. ............. 72/253.1; 72/254; 72/257; 72/264; 29/890.03; 29/890.035

(58) Field of Classification Search .................... 29/890.03–890.054, 412–417; 72/254, 255, 257, 264, 268, 270
See application file for complete search history.

(56) References Cited

U.S. PATENT DOCUMENTS

| | | | | |
|---|---|---|---|---|
| 1,859,707 A * | 5/1932 | Wycliffe | ......................... | 72/255 |
| 2,131,173 A * | 9/1938 | Greenall | ......................... | 72/18.3 |
| 2,978,797 A * | 4/1961 | Ekelund | ...................... | 72/370.18 |
| 3,267,712 A * | 8/1966 | Atkin | ............................... | 72/260 |
| 4,879,891 A * | 11/1989 | Hinshaw | ......................... | 72/254 |
| 5,435,161 A * | 7/1995 | King | ................................ | 72/16.5 |
| 5,794,685 A * | 8/1998 | Dean | ............................. | 165/121 |
| 6,138,352 A * | 10/2000 | Smith et al. | ................ | 29/890.03 |
| 6,374,491 B1 * | 4/2002 | Trobough | .................. | 29/890.03 |
| 6,419,007 B1 | 7/2002 | Ogawara et al. | | |
| 6,466,444 B2 * | 10/2002 | Cheung | .......................... | 361/703 |
| 6,539,614 B2 * | 4/2003 | Trobough | ........................ | 29/727 |
| 6,657,862 B2 | 12/2003 | Crocker et al. | | |
| 6,671,172 B2 | 12/2003 | Carter et al. | | |
| 6,714,415 B1 | 3/2004 | Shah | | |
| 6,769,175 B2 * | 8/2004 | Wagner | ...................... | 29/890.03 |

(Continued)

FOREIGN PATENT DOCUMENTS

CN 2208115 Y 9/1995

(Continued)

*Primary Examiner* — Edward Tolan
*Assistant Examiner* — Lawrence J Averick
(74) *Attorney, Agent, or Firm* — Keating & Bennett, LLP

(57) ABSTRACT

A heat sink has a plurality of radially extending radiating fins, which are arranged annularly on the outer circumferential surface of a cylindrical base to be integral with that surface. The base is formed to have a cylindrical shape having a center axis. The base is formed to be solid-core. The heat sink is ground such that a cooling object contact portion having a generally cylindrical shape projects from the end surface of the heat sink in the axial direction. An annular groove is ground out along the outer circumference of a contact surface of the cooling object contact portion. An attaching member is attached on the outer circumferential surface of the cooling object contact portion, and a pressure application portion is entirely pressed by a pressing machine. The pressure application portion is plastically deformed outward in the diameter direction, so that the attaching member is fixed in between.

16 Claims, 14 Drawing Sheets

U.S. PATENT DOCUMENTS

| | | | |
|---|---|---|---|
| 6,816,374 B2 * | 11/2004 | Patel et al. | 361/697 |
| D501,450 S | 2/2005 | Watanabe et al. | |
| D509,484 S | 9/2005 | Mochizuki et al. | |
| D509,485 S | 9/2005 | Mochizuki et al. | |
| D511,326 S | 11/2005 | Watanabe et al. | |
| D516,526 S | 3/2006 | Watanabe et al. | |
| 7,123,483 B2 | 10/2006 | Otsuki et al. | |
| 7,188,418 B2 * | 3/2007 | Shah | 29/890.05 |
| D541,229 S | 4/2007 | Watanabe et al. | |
| 7,221,567 B2 | 5/2007 | Otsuki et al. | |
| 7,269,013 B2 | 9/2007 | Chen et al. | |
| 7,278,209 B2 * | 10/2007 | Otsuki et al. | 29/890.047 |
| 2001/0055199 A1 * | 12/2001 | Cheung | 361/709 |
| 2002/0017378 A1 | 2/2002 | Hu | |
| 2002/0046826 A1 | 4/2002 | Kao | |
| 2003/0131970 A1 * | 7/2003 | Carter et al. | 165/80.3 |
| 2004/0045163 A1 * | 3/2004 | Carter et al. | 29/890.03 |
| 2005/0141193 A1 * | 6/2005 | Otsuki et al. | 361/695 |
| 2005/0280992 A1 * | 12/2005 | Carter et al. | 361/697 |
| 2008/0223551 A1 * | 9/2008 | Otsuki et al. | 165/80.3 |
| 2008/0236791 A1 * | 10/2008 | Wayman | 165/80.3 |
| 2009/0073656 A1 * | 3/2009 | Otsuki et al. | 361/697 |
| 2009/0147478 A1 * | 6/2009 | Yamashita et al. | 361/697 |
| 2010/0091495 A1 * | 4/2010 | Patrick | 362/249.02 |
| 2011/0030217 A1 * | 2/2011 | Morino et al. | 29/890.03 |

FOREIGN PATENT DOCUMENTS

| | | |
|---|---|---|
| CN | 1269267 A | 10/2000 |
| CN | 2482133 Y | 3/2002 |
| JP | 2005327854 | 11/2005 |
| JP | 2006032941 | 2/2006 |
| JP | D1295760 | 3/2007 |
| JP | D1296655 | 3/2007 |
| TW | M258318 U | 3/2005 |
| TW | D118994 | 6/2006 |
| TW | I260965 B | 8/2006 |
| TW | D118870 | 9/2006 |
| TW | M302241 U | 12/2006 |
| TW | M302867 U | 12/2006 |

* cited by examiner

RADIATOR, HEAT SINK FAN, AND RADIATOR MANUFACTURING METHOD

BACKGROUND

1. Technical Field

The present invention relates to a radiator which conducts heat of an electronic component, a heat sink fan, and a radiator manufacturing method. Particularly, the present invention relates to a radiator which cools a cooling object such as an electronic component including an MPU, etc. The present application is relevant to the below-identified Japanese patent applications. The present application claims priorities from Japanese Patent Applications 1. Japanese Patent Application No. 2007-005490 filed on Jan. 15, 2007; and
2. Japanese Patent Application No. 2007-083091 filed on Mar. 27, 2007, the contents of which are incorporated herein by reference.

2. Description of the Related Art

Recently, the clocking frequency of MPUs (Micro Processing Unit) has significantly increased, and heat generated by MPUs is increasing along with the increase of the clocking frequency. MPUs are subject to the risk of malfunctioning due to this heat generated by themselves, and cooling of MPUs is therefore a critical issue. Electronic components such as MPUs that generate heat are equipped with a heat sink fan in which a heat sink of a metal material formed of a plurality of radiating fins and a cooling fan which supplies cooling air to the heat sink are integrated. It is demanded that the cooling efficiency of the heat sink fan and the heat conductance from the MPU to the heat sink be improved.

On the other hand, there is a cost-cut demand for electronic devices including an MPU, most typically, personal computers. Accordingly, a heat sink that has a high cooling performance and at the same time can be manufactured at a low cost is demanded.

In order to improve the cooling efficiency of a heat sink, it is common to increase the surface area of the entire heat sink. The surface area can be increased by decreasing the circumference-wise thickness of the radiating fins, and assembling each radiating fin so as to radially extend outward in the diameter-wise direction. However, since the heat sink loses a bit of its robustness when the radiating fins become thinner, the extend to which the radiating fins can be thinned is limited. Furthermore, if there is left a too narrow space between the radiating fins at their starting end on a base, from which the radiating fins extend, the cooling air supplied to the heat sink does not smoothly flow between the radiating fins. Hence, it is not possible to improve the cooling efficiency simply by increasing the surface area of the heat sink.

In order to improve the cooling performance of a heat sink, it is necessary to form the heat sink such that conductance loss that might occur while heat is conducted from the MPU as the heat generator to the radiating fins becomes small. For example, Unexamined Japanese Patent Application Publication No. 2005-327854 discloses a heat sink comprising a base which is formed of a cylindrical hollow portion having a hollow thereinside, and a high heat conductance member snugly put inside the hollow portion so as to be capable of conducting heat to the hollow portion. Radiating fins are formed on the outer circumference of this base, and the high heat conductance member is made of copper that is higher in heat conductance than the material of the radiating fins and hollow portion (aluminum).

Further, to impart a high cooling performance to a heat sink, it is preferable to make the contact pressure at the contact interface between the heat sink and the MPU high. This is because if the contact pressure is high, it is possible to make the contact heat resistance, which is to occur between the heat sink and the MPU, small. In this case, it is necessary to appropriately fix the heat sink on the MPU to make the contact pressure between the heat sink and the MPU high.

Unexamined Japanese Patent Application Publication No. 2006-32941, for example, discloses a method of forming a groove in the outer circumferential surface of a core portion of a base, and fixing a support member (attaching member) to the heat sink such that an opening formed in the support member fits the groove. In addition to the method disclosed in Unexamined Japanese Patent Application Publication No. 2006-32941, there is known a method of sandwiching an attaching member between a heat sink and a core portion and fix them in this state.

SUMMARY

However, while heat conductance between components of the same kind is determined according to the material coefficient of the components, components of different kinds, if made to contact each other, develop a larger contact heat resistance depending on the condition on the contact interface, which will lead to a drop of the heat conductance. In a case where a high heat conductance member is fit inside the hollow of a hollow portion as in the configuration disclosed in Unexamined Japanese Patent Application Publication No. 2005-327854, contact heat resistance will occur at the contact interface between the hollow and the high heat conductance member.

Further, in the heat sink disclosed in Unexamined Japanese Patent Application Publication No. 2005-327854, copper has a larger specific gravity than aluminum. Hence, the bulkier the high heat conductance member is in the heat sink, the higher the heat conductance, but together with increase of the weight of the heat sink. Furthermore, copper is harder to procure than aluminum, which makes the material cost high.

What is more, the configuration disclosed in Unexamined Japanese Patent Application Publication No. 2005-327854 requires a step of snugly putting the high heat conductance member inside the hollow of the hollow portion. To be more specific, it is necessary to form the heat sink in a manner of forming a through hole centered by the center axis of a base in the center of the base, and pressing a cylindrical core fit into the through hole. In this case, in order to make the contact heat resistance that is to occur at the contact interface between the side surface of the core and the through hole small, it is desirable to press the core fixed such that the contact pressure becomes large. For this purpose, the pressing fixation is by so-called shrink fitting, in which the base is heated to a high temperature, the core is inserted into the through hole of the base while the inner diameter of the through hole is expanded, and then the base is cooled. However, a conventional method of this kind requires many manufacturing steps, and might sacrifice the robustness of the heat sink because the heat sink has to undergo large temperature changes along with heating and cooling. Furthermore, if the range of temperatures within which the heat sink is used exceeds the assumed temperature, the core might slip down due to the thermal expansion of the heat sink.

As obvious from the above, the configuration disclosed in Unexamined Japanese Patent Application Publication No. 2005-327854 has problems in terms of procurement, cost, reliability, and productivity.

Further, as described above, the heat sink must be firmly fixed to the MPU in order for the cooling performance of the heat sink to be improved. The fixing method disclosed in Unexamined Japanese Patent Application Publication No. 2006-32941 fixes the members only by way of lock-in of a protrusion formed in the opening of the support member into the groove. Thus, rotation withstandness against rotation about the center axis of the heat sink is poor. Furthermore, depending on the manufacturing accuracy of the groove and the support member, they might get loose from each other in the direction in which the center axis runs. Hence, the fixing method disclosed in Unexamined Japanese Patent Application Publication No. 2006-32941 cannot achieve high reliability.

Other conventional methods than that disclosed in Unexamined Japanese Patent Application Publication No. 2006-32941 include many assembling steps. A fixing method that includes a small number of manufacturing steps and can achieve a high fixing strength is demanded.

Therefore, it is an object of an aspect of the innovations herein to provide a radiator, a fan, and a radiator manufacturing method, which are capable of overcoming the above drawbacks accompanying the related art. The above and other objects can be achieved by combinations described in the independent claims. The dependent claims define further advantageous and exemplary combinations of the innovations herein.

To overcome the above problem, according to the first aspect related to the innovations herein, one exemplary radiator for conducting heat of an object includes: a columnar base which has a plane and extends substantially perpendicularly to the plane, and whose region defined by the plane is solid-core in a direction substantially perpendicular to the plane; and a plurality of fins which extends outward from the base, wherein the base and the plurality of fins are made of the same material as each other and integral with each other.

According to the second aspect related to the innovations herein, one exemplary heat sink fan includes: the radiator described above; and a cooling fan disposed at a side of the base opposite to the plane and supplying an air flow to the radiator, wherein the cooling fan includes: an impeller having a plurality of blades which rotate about a center axis of the impeller to generate the air flow in a direction of axis; a motor which rotates the impeller; and a housing which has an air tunnel surrounding the impeller from a distal side of the impeller, the housing supporting the motor.

According to the third aspect related to the innovations herein, one exemplary manufacturing method of a radiator for cooling an electronic component includes: (a) heating a material of the diameter; (b) extruding the heated material from a first die to obtain at least one solid and columnar member made of the material; and (c) cutting the solid and columnar member.

According to the fourth aspect related to the innovations herein, one exemplary manufacturing method of a radiator for cooling an electronic component includes: (a) preparing a material which is solid-core and columnar; (b) heating the material in a furnace; (c) separating the material into a plurality of columnar pieces by pressing the material into a separating die; (d) pressing the plurality of columnar pieces obtained by the separating into a heat sink die, and extruding the plurality of columnar pieces from the heat sink die as joining the pieces together; and (e) cutting the plurality of columnar pieces extruded from the heat sink die and joined together.

According to the fifth aspect related to the innovations herein, one exemplary radiator is manufactured by the above-described manufacturing method.

DESCRIPTION OF EXEMPLARY EMBODIMENTS

A radiator according to a preferred embodiment of the present invention, a method of manufacturing the radiator, and a radiating fan will be explained below with reference to FIG. 1 to FIG. 21. In the following description, a heat sink is one example of a radiator. Further, the direction from the top to the bottom of each drawing sheet is herein referred to as "upward and downward direction" for the sake of convenience. However, this is not to limit the direction of actual assembling.

Figure 1:
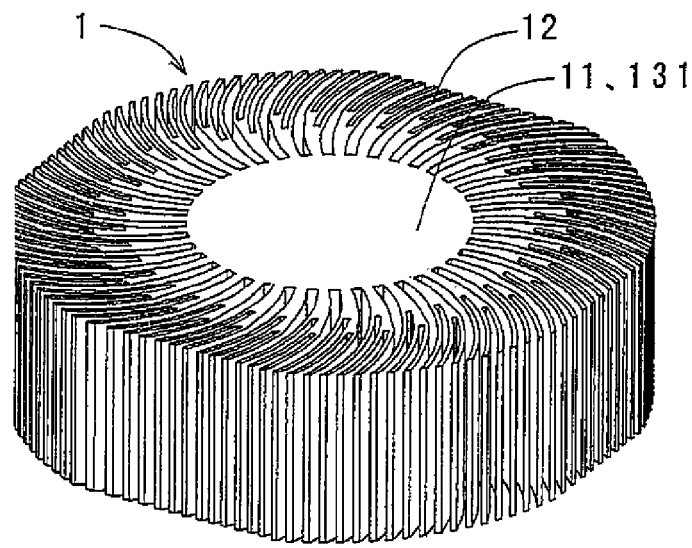
FIG. 1 is a perspective diagram showing a heat sink 1 according to a preferred embodiment of the present invention.
Figure 2:
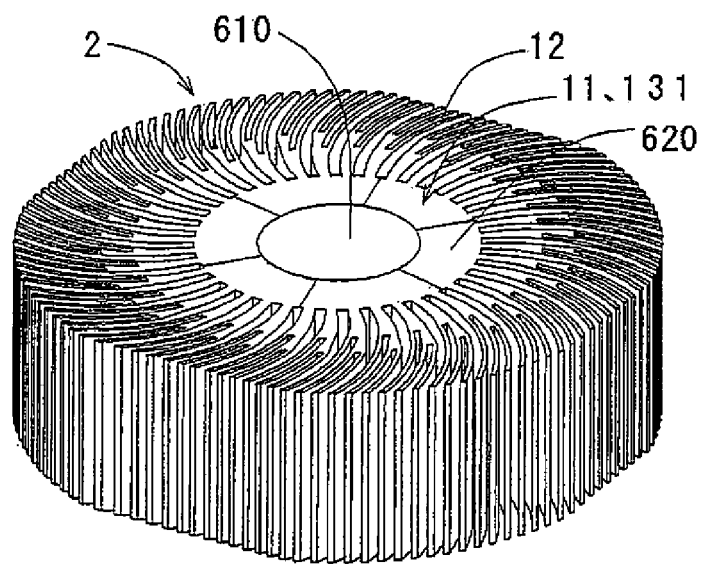
FIG. 2 is a perspective diagram showing a heat sink 2 according to the preferred embodiment of the present invention.

FIG. 1 is a perspective diagram showing one example of a heat sink 1 according to a preferred embodiment of the present invention. FIG. 2 is a perspective diagram showing one example of a heat sink 2 according to a preferred embodiment of the present invention.

The heat sink 1 is a radiator formed by shaping a material having a relatively high heat conductance such as an aluminum-based material, etc., by extruding (drawing). In the present preferred embodiment, aluminum or aluminum alloy may be used in shaping the heat sink 1. The heat sink 1 has a columnar base 11, and a plurality of radiating fins 12 which extend from the inside of the based outward. The columnar base 11 has a contact surface 131, and extends substantially perpendicularly to the contact surface 131. The base 11 is formed such that it has a generally circular shape when seen from the direction substantially perpendicular to the contact surface 131, and the region defined by the contact surface 131 is solid-core in the direction substantially perpendicular to the contact surface 131. That is, as illustrated in FIG. 1, the base 11 is formed as a cylinder having a center axis, and formed to be solid-core. Note that the contact surface 131 is one example of a plane recited in the claims.

Generally, the heat sink 1 is formed to have a large area for contact with the atmosphere, i.e., a large surface area. In the present example, the plurality of radiating fins 12 are arranged along the circumference of the generally circular base 11 having a center axis that penetrates generally the center of the circular shape. That is, the plurality of radiating fins 12 are formed to protrude from the external surface of the cylindrical body of the cylindrical base 11 outward in the direction of the diameter. The plurality of radiating fins 12 are formed to be integral with the base 11. This enables the heat sink 1 to appropriately conduct heat of an electronic component from the base 11 to the radiating fins. In the present example, as shown in FIG. 1, the plurality of radiating fins 12 that extend radially from the base 11 are arranged on the outer circumference of the base 11 to form an annular shape. Particularly, in order that the surface area becomes large, the radiating fins 12 may be formed to curve in the direction of their arrangement. By giving the radiating fins 12 a curve, the surface area of the radiating fins 12 is increased. The shape of the radiating fins 12 for enlarging the surface area of the heat sink 1 is not limited to the above, but arbitrary shape modification is available.

The base 11 and the plurality of radiating fins 12 are made of the same material. In the present example, the base 11 and the radiating fins 12 are made of aluminum alloy.

Since in the present example, the radiating fins 12 and the base 11 are formed integrally and the base 11 is formed to be solid-core as described above, no contact heat resistance is generated internally between the contact surface 131 and the radiating fins 12. Accordingly, it is possible to minimize loss by heat resistance and to improve the cooling efficiency of the heat sink. Further, it is possible to achieve a heat sink having a small contact heat resistance without performing pressing fixation by shrink fitting as conventional.

Further, since aluminum-based materials are generally harder than copper-based materials, the former materials can be finished with a higher dimensional accuracy when extruded (drawn) using a die having a more complex shape. As compared with this, copper-based materials are very difficult to shape into a complex shape by extruding (drawing), and finished with an extremely poor dimensional accuracy. Thus, it is very difficult to form a heat sink having a complex shape by shaping a copper-based material by extruding (drawing). However, in the present example, not a copper material but an aluminum alloy material is used for the radiating fins 12 and the base 11, and a heat sink can therefore be formed appropriately even if its shape is complex.

FIG. 2 shows a modified example of the heat sink 1 shown in FIG. 1. The base 11 of the heat sink 2 shown in FIG. 2 is formed of a plurality of columnar pieces that extend in the direction substantially perpendicular to the contact surface 131. A center material 610 is one of the plurality of columnar pieces, and a center piece having a generally cylindrical shape including the center axis. Radiating fin materials 620 are arranged around the center material 610, and formed integrally with one end of the plurality of radiating fins 12. As will be described in detail later, when a heat sink is formed by using a separating die according to the present invention, a heat sink 2 as shown in FIG. 2 will be manufactured.

Figure 3:
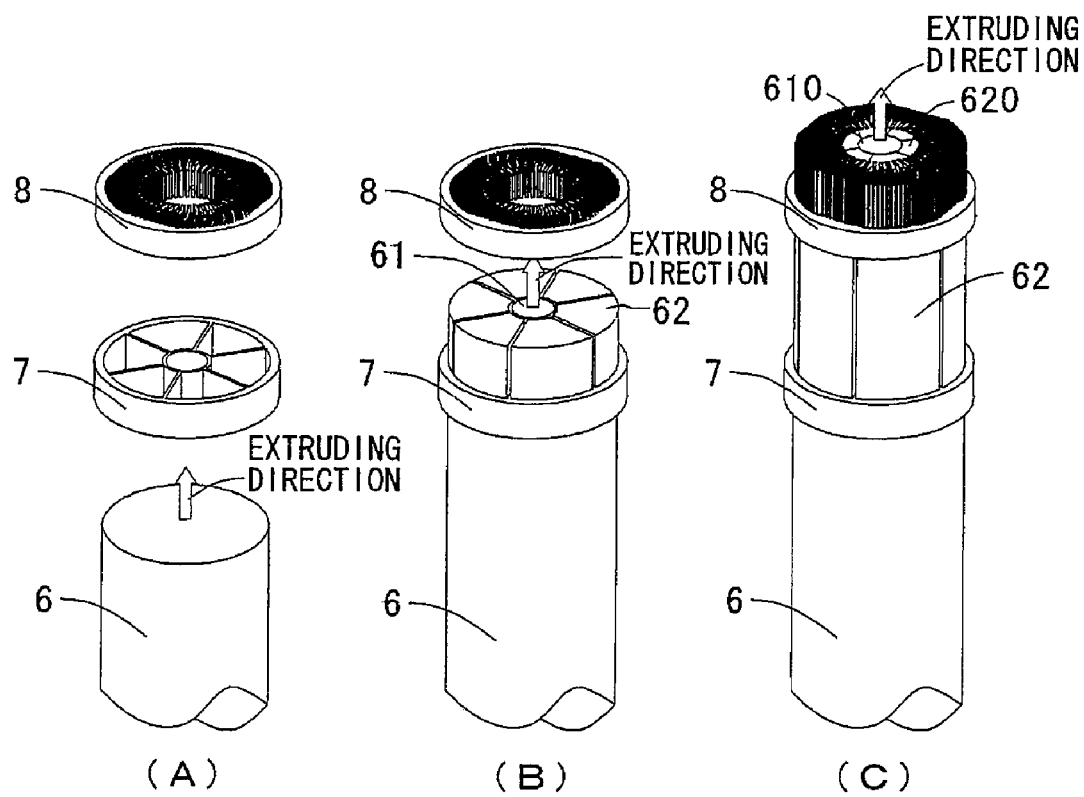
FIGS. 3(A) to 3(C) are perspective diagrams showing the formation of the heat sink 2, together with dies.
Figure 4:
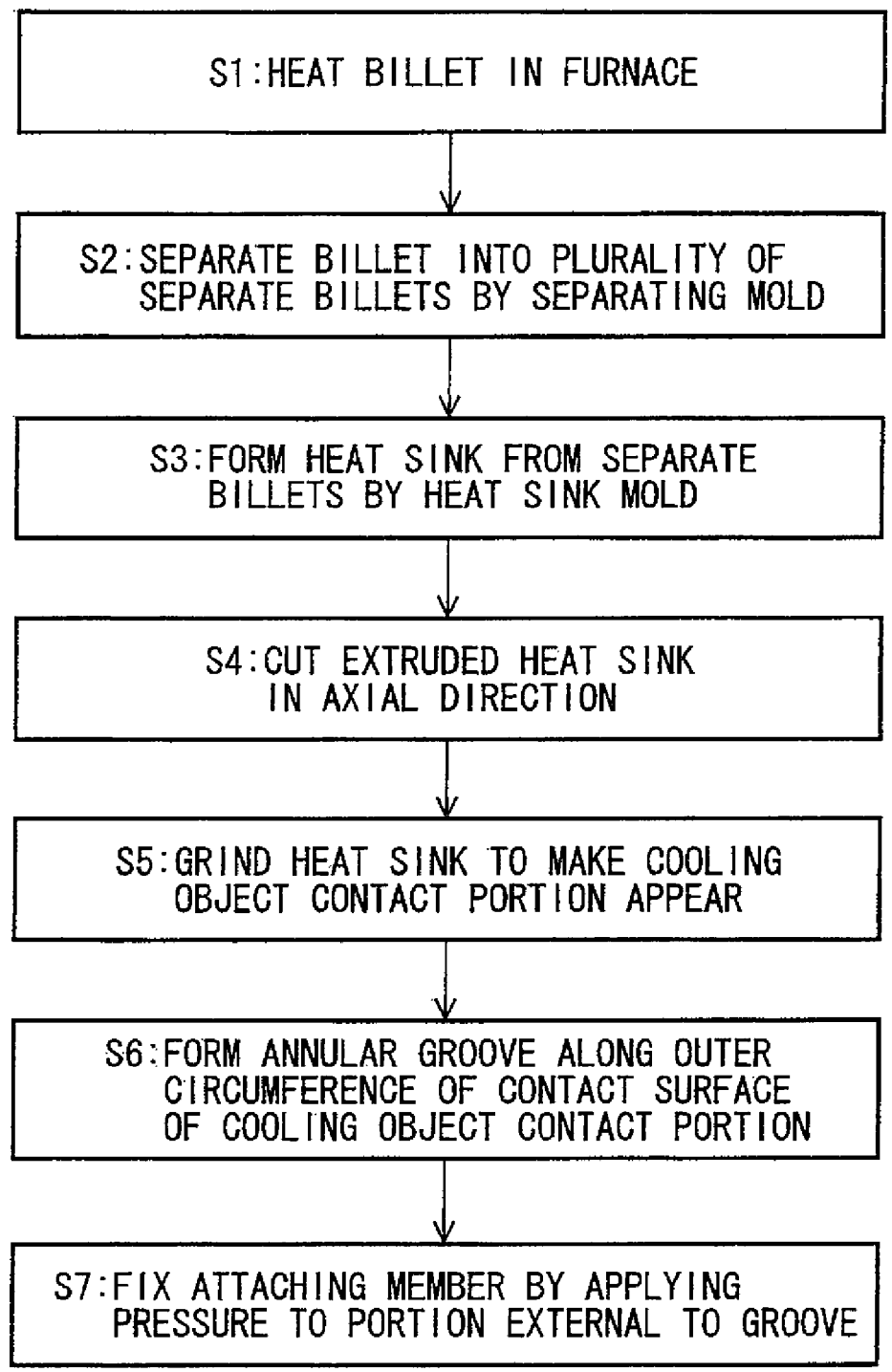
FIG. 4 is a diagram showing the flow up to the completion of the heat sink 2.

Next, a method for shaping a heat sink by extruding (drawing) will be specifically described. FIG. 3 is a perspective diagram showing dies to illustrate a manufacturing flow up to the completion of the heat sink 2. FIG. 4 is a diagram explaining the flow up to the completion of the heat sink 2.

6000 Al—Mg—Si series or 1000 pure Al series is mainly used as the aluminum alloy for the heat sink (1, 2). Among the 6000 Al—Mg—Si series, 6063 is often used. 6063 has excellent extrusion characteristics and is used as a constructional material that is not particularly required to have a high robustness, such as a sash for constructional purpose. Since the heat sink (1, 2) is not required to have as high a robustness as that of a constructional material for constructional purpose, 6063 is used most often. In a case where heat conductance is the highest priority, 1060 or 1070 among 1000 pure Al series is used.

First, a billet 6 (a metal clod used for flatting or rolling manufacture) made of an aluminum alloy and having a cylindrical shape is prepared. Then, the billet 6 is heated to about 500° C. in a furnace (step S1). The billet 6 heated in the furnace has become softer than usual when it is at ambient temperatures. In this state, the billet 6 is pressed into a separating die 7 shown in FIG. 3A. The separating die 7 has a shape that separates the billet 6 pressed therein into seven parts (step S2).

In the present example, the billet 6 is separated by the separating die 7 into seven parts, but septisection is not essential. That is, the billet 6 may be separated into an arbitrary number of parts according to the shape and size of the heat sink. The billet 6 pressed into the separating die 7 of the present example is separated into a plurality of (seven) columnar separate materials 61 and 62. As shown in FIG. 3B, the separate material 61 is the portion that has constituted the center portion of the billet 6 and has occurred as separated by the separating die 7. The plurality of separate materials 62 are so separated as to surround the separate material 61.

Next, the separate materials 61 and 62 are pressed into a heat sink die 8 (step S3). The heat sink die 8 has a shape that will create a plurality of radiating fins around the base 11 as shown in FIG. 3C, when it extrudes the separate materials 61 and 62. The separate materials 61 and 62 contact one another to get joined together, when pressed into the heat sink die 8. That is, the heat sink 2 manufactured in this method is completed with the billet 6 separated, the radiating fin materials 620 arranged around the center material 610, and these materials joined together.

In extruding (drawing) the heat sink of the present preferred embodiment, a direct method is mainly used. In the direct method, the material is directly extruded in the extruding direction. Specifically, according to the direct method, a heated billet is inserted into a container in which an extruding die is set, and then the billet is compressed toward the die. The compressed billet is extruded throughout the die to be a predetermined shape. The direct method produces a friction between the billet and the container when extruding. In this case, if the pressure applied to each local portion of the billet when going through the die varies from portion to portion, the metal flow (the flow of the metal structure) might become un-uniform. To be more specific, when the material is to be extruded from the heat sink die 8, the portions where the radiating fins 12 are to be formed have to go trough a narrower path than that for the portion where the base 11 is to be formed. Hence, when performing extruding (drawing), the pressure that occurs in the billet 6 about where the radiating fins 12 are to be formed becomes larger than the pressure in the center portion of the billet 6, to make the material harder to flow. Hence, in a case where the separating die 7 is not used, the metal flow of the billet might become un-uniform to make high-accuracy extruding (drawing) unavailable.

However, with the use of the separating die 7, the billet 6 is separated into the separate materials 61 and 62 before pressed into the heat sink die 8. This segmentalizes the metal flow of the billet 6 to thereby reduce the un-uniformity of the metal flow among the separate materials 61 and 62. Hence, even if the shape of the radiating fins 12 is complex, the heat sink 2 can be formed appropriately. In particular, by arranging the center material 610 at the center of the base 11, it is possible to reduce the thickness of the portion formed between the radiating fins 12 and a part (610) of the base 11, which makes the manufacture easier.

The heat sink 2 finished with extruding (drawing) is completed as a lengthy heat sink 2 which is longer in the axial direction as the billet 6 is. Soon after extruded, the heat sink 2 is soft because it has retained the high temperature. Therefore, the heat sink 2 is vulnerable to distortion, and some heat sinks 2 get actually distorted. Hence, if the heat sink 2 is tensioned with its both ends pulled oppositely to each other, the distortion of the heat sink 2 is corrected to be straight and then cooled. With this correction, dimensional accuracy is imparted to the heat sink 2.

The heat sink 2 manufactured by extruding (drawing) is lengthy. Thus, the heat sink 2 is cut by a plane substantially perpendicular to the axial direction (step S4).

In the present example, the temperature of the billet 6 is set to about 500° C., but the billet may be set to any appropriate temperature according to the extruding (drawing) speed or the composition of the billet. For example, the temperature may be set to about 90% or lower of the melting point of the material. In the case of an aluminum-based material, the billet 6 may be set to equal to or higher than about 400° C. to equal to or lower than about 600° C. Further, it is also possible to adjust the temperature of the billet 6 by adjusting the temperature of the separating die 7 and the heat sink die 8.

The above-described manufacturing process may further include a step of adjusting the temperature of the plurality of separate materials 61 and 62 obtained by separation by the separating die 7. In this case, the temperature of the plurality of separate materials 61 and 62 may be about 90% or lower of the melting point of the material. In the case of an aluminum-based material, the temperature of the separate materials 61 and 62 may be set to equal to or higher than about 400° C. to equal to or lower than about 600° C.

Alternatively, the above-described manufacturing process may include a step of adjusting the temperature of each of the separating die 7 and the heat sink die 8. The temperature of each of the separating die 7 and the heat sink die 8 may be adjusted to equal to or lower than about 600° C. Or, the temperature of each of the separating die 7 and the heat sink die 8 may be adjusted to be higher than the temperature at which the billet 6 is heated in the furnace.

Further, a step of adjusting the speed at which the material is extruded from the separating die 7 and the heat sink die 8 may be included. The material extruding speed may be determined based on at least one of the temperature, composition and viscosity of the heated material. Further, the material extruding speed may be determined based on the shape and temperature of the separating die 7 or the heat sink die 8. For example, the higher the temperature of the heated material, the higher the material extruding speed may be. The lower the viscosity of the material, the higher the material extruding speed may be. The more complex the shape of the die, the lower the material extruding speed may be. For example, the smaller the grooves in the die for forming the radiating fins 12 are or the more grooves the die has, the lower the material extruding speed may be.

In the present example, the separate materials 61 and 62 extruded from the separating die 7 are extruded directly into the heat sink die 8. That is, before the material is fully extruded from the separating die 7, the separate materials 61 and 52 are subject to the extrusion by the heat sink die 8. This can improve the throughput. Note that it may be after the material is fully extruded from the separating die 7 that the separate materials 61 and 62 go through the extrusion by the heat sink die 8. In this case, the speed at which the material is extruded from the separating die 7 may be different from the speed at which the separate materials 61 and 62 obtained by the separation by the separating die 7 are extruded from the heat sink die 8.

Further, the present example uses only one separating die 7. However, a plurality of separating dies 7 may be prepared. For example, the plurality of separate materials 61 and 62 that are extruded from the separating die 7 may further be separated by going through another separating die.

In this manner, the heat sink 2 shown in FIG. 2 is formed. The base 11 is cylindrical as for both the heat sinks explained with reference to FIG. 1 and FIG. 2, but may not necessarily be cylindrical. For example, the base 11 may have a generally symmetric shape when seen from the direction substantially perpendicular to the contact surface 131. The symmetric shape may be a shape symmetric with respect to a point or a shape symmetric with respect to a line. Specifically, the shape may be an equilateral triangle, a square, a rectangle, a rhombus, an ellipse, or a regular polygon. In this case, the base 11 forms a columnar body having any of these shapes. Further, the center material 610 explained with reference to FIG. 2 is cylindrical, but may not necessarily be cylindrical. The center material 610 may have a generally symmetric shape when seen from the direction substantially perpendicular to the contact surface 131. In this case too, the plurality of radiating fin materials 620 are arranged around the center material 610, and formed integrally with one end of the plurality of radiating fins 12. By making the base 11 symmetric, it is possible to make heat conductance to the radiating fins uniform.

Further, as explained with reference to FIG. 3 and FIG. 4, each of the plurality of radiating fins 12 of the present example extends in the direction substantially perpendicular to the contact surface 131 as they have been extruded from the heat sink die 8. However, it is also allowed to form each of the plurality of radiating fins 12 to extend with a slant with respect to the direction substantially perpendicular to the contact surface 131, by, for example, extruding the billet as rotating it. This will further enlarge the surface area of the fins.

Figure 5:
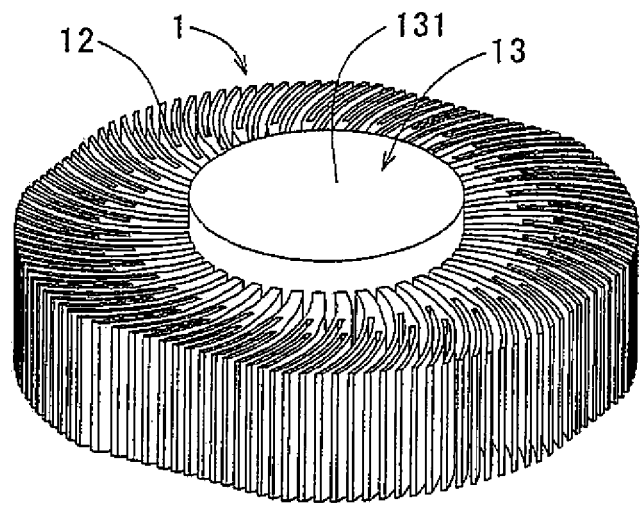
FIG. 5 is a perspective diagram showing a process included in a step of grinding a cooling object contact portion.
Figure 6:
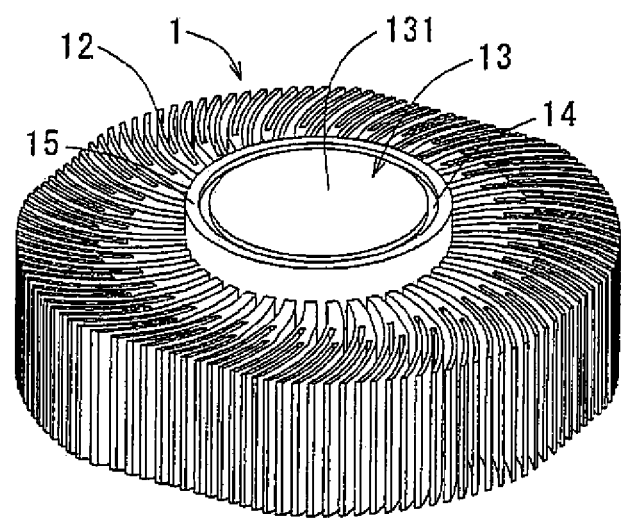
FIG. 6 is a perspective diagram showing a process included in the step of grinding the cooling object contact portion.

FIG. 5 and FIG. 6 are perspective diagrams showing a process included in a step of grinding out a cooling object contact portion 13 of the heat sinks 1 and 2. The cut-short heat sink 1 is chucked on a lathe. The heat sink 1 has the radiating fins 12 ground down by the lathe such that a cooling object contact portion 13 having a generally cylindrical shape projects from the end surface of the heat sink 1 in the axial direction (step 5). In this case, when seen from the direction parallel with the contact surface 131, the contact surface 131 constitutes the top surface of a protrusion which protrudes in the direction substantially perpendicular to the contact surface 131 as compared with the plurality of radiating fins 12. The cooling object contact portion 13 is formed on this top surface to have contact with an MPU. Since the cooling object contact portion 13 of the heat sink 1 of the present preferred embodiment is cylindrical as shown in FIG. 5, manufacturing steps will be most saved if it is processed by a lathe. However, the shape may be otherwise, so a cooling object contact portion 13 having, for example, a quadratic prism shape may be formed with the use of a milling machine, etc. Further, when the cooling object contact portion 13 should have a smaller diameter, the outer circumferential surface of the base 11 may be trimmed by a lathe. Note that the cooling object contact portion 13 is one example of the contact portion. The contact surface 131 is partially formed into the cooling object contact portion 13 by grinding.

Next, as a grinding process by a lathe, an annular groove 14 is ground out in the end surface of the cooling object contact portion 13 (the end surface being a surface to be brought into contact with an MPU 3; the contact surface 131) along the outer circumference, as shown in FIG. 6 (step S6). The annular groove 14 is formed a bit inward such that a pressure application portion 15 (a portion to be pressurized by pressing at a later-described step) remains at the outer circumference of the contact surface 131. Hence, the contact surface 131 contacts the cooling object (MPU 3) only at the region which is more inward than the annular groove 14.

Figure 7:
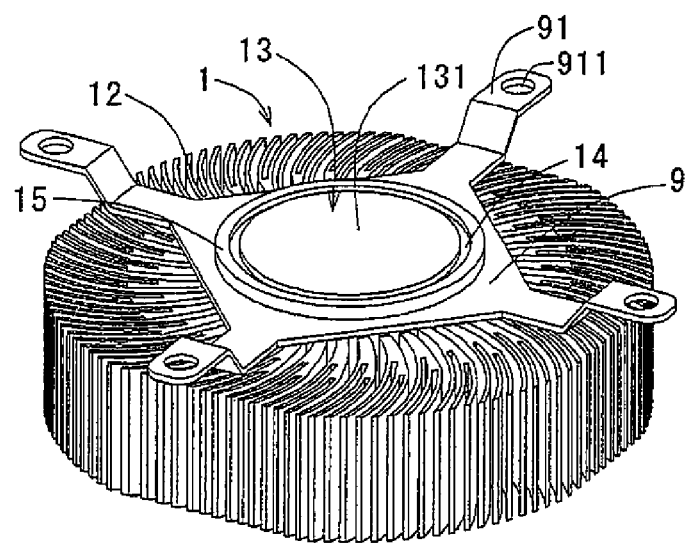
FIG. 7 is a perspective diagram showing how an attaching member is fixed on the heat sink.
Figure 8:
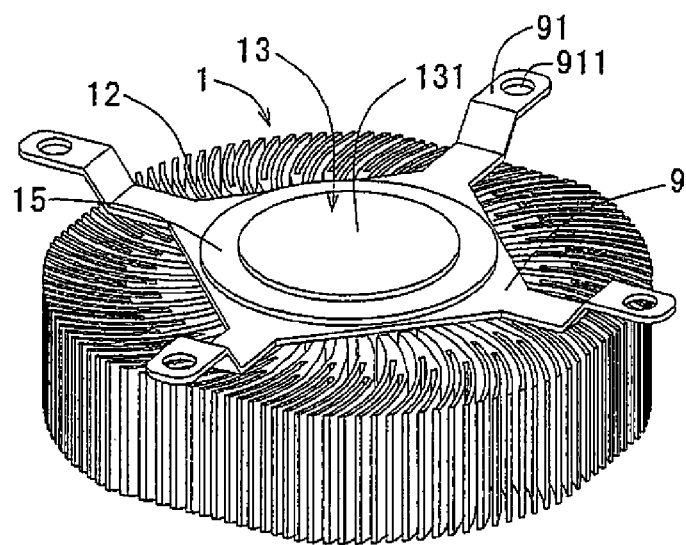
FIG. 8 is a perspective diagram showing the heat sink on which the attaching member is fixed.
Figure 9:
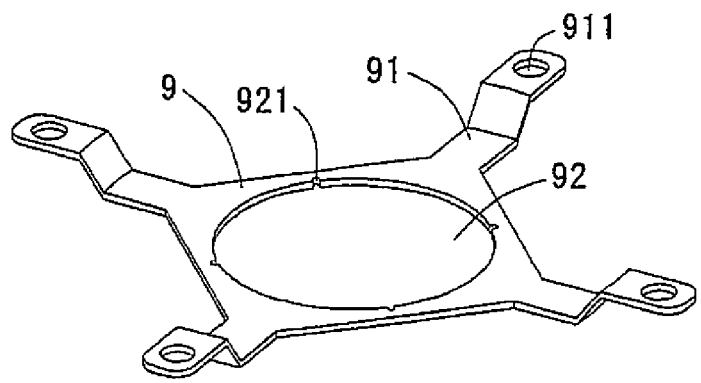
FIG. 9 is a perspective diagram showing the attaching member.

FIG. 7 is a perspective diagram showing the process of fixing an attaching member to the heat sink of the present preferred embodiment. FIG. 8 is a perspective diagram showing the heat sink 1 to which the attaching member is fixed. FIG. 9 is a perspective diagram of the attaching member. The heat sink 1 is utilized for cooling an MPU 3. Hence, its contact surface 131 has to have contact with the MPU 3. Therefore, the heat sink 1 has to be appropriately attached to a motherboard 31 on which the MPU 3 is mounted. As shown in FIG. 9, the attaching member 9 has a through hole 92 at the center, and a plurality of attaching legs 91 that extend outward in the diameter direction. A through hole 911 is formed at the tip of the attaching legs 91, into which a fixing member 90 for fastening the motherboard 31 and the attaching member 9 together is to be inserted. A stainless material having a high rust preventing property such as SUS, etc. is used for the attaching member 9.

First, the attaching member 9 is attached such that the through hole 92 formed at the center of the attaching member 9 is fitted on the outer circumferential surface of the projecting cooling object contact portion 13, as shown in FIG. 7. When attaching the attaching member 9 on the cooling object contact portion 13, the attaching member 9 is pressed down until it abuts on the end surface of the radiating fins 12. In this state, the pressure application portion 15 has its entire region pressed downward in the axial direction in FIG. 7 by a pressing machine (step S7). The pressed pressure application portion 15 is plastically deformed outward in the diameter direction. This fixes the attaching member 9 between the plastically deformed pressure application portion 15 and the end surface of the radiating fins 12, as shown in FIG. 8. Since the pressure application portion 15 is plastically deformed, its shape will be kept as thusly deformed. This will keep the attaching member 9 as fixed on the cooling object contact portion 13. With the pressurization, the outer frame of the cooling object contact portion 13 is deformed such that the diameter elongates outward in the diameter direction. With the outer frame of the cooling object contact portion 13 pressured, the outer frame locks with the through hole 92 of the attaching member 9 to make the attaching member 9 fixed on the outer frame of the cooling object contact portion 13.

Notches 921 are formed at plural positions (in the present example, four positions) of the inner circumferential surface of the through hole 92 of the attaching member 9. With the outer diameter of the cooling object contact portion 13 elongated, the inner circumferential surface of the through hole 92 of the attaching member 9 bites into the outer circumferential surface of the cooling object contact portion 13. At this time, with the notches 921 in the inner circumferential surface of the through hole 92, the attaching member 9 will have a better withstandness against relative rotation, with respect to the cooling object contact portion 13, in the circumferential direction about the center axis.

A conventional heat sink structure has a core pressed fit into the center of the base. The reason is as follows. Extruding (drawing) of a heat sink is applied to a base which has a through hole in the center. Generally, such a heat sink shape is referred to as hollow shape, and no extraordinary extruding (drawing) is required to obtain such a shape. Accordingly, a core has to be pressed fit into the through hole by shrink fitting described above. However, pressing fit of the core by shrink fitting includes the step of heating and then cooling the heat sink. This gives heat shocks (repetitive heating and cooling) to the heat sink to cause a risk of the heat sink losing its mechanical strength. Particularly, the surface of the base on the outer circumferential surface of the core is thin-walled, and includes surface regions to which the separate materials are joined. Therefore, if the mechanical strength is poor, the surface regions to which the separate materials are joined might be torn down to let the core slip off. However, the heat sink of the present example has a solid-core base and is therefore free from core slip off. And it requires no shrink fitting and thus will experience no mechanical strength drop.

Figure 10:
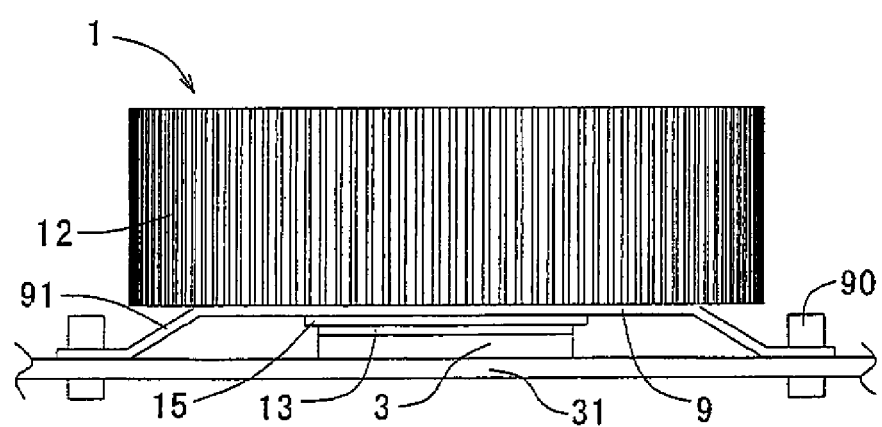
FIG. 10 is a plan view showing an MPU and the heat sink, which are brought into contact with each other.

Next, how heat is conducted from a heat-generating MPU 3 to the heat sink will be explained. FIG. 10 is a plan view showing an MPU and a heat sink, which are brought into contact with each other. The MPU 3 is mounted on a motherboard 31. The core contacts the MPU 3 at its contact surface. A heat conducting member is interposed between the MPU 3 and the contact surface. Heat generated by the MPU 3 is conducted to the core. That is, the value of the contact heat resistance that occurs between the MPU 3 and the contact surface 131 is critical. For example, if the surface of each of the MPU 3 and the contact surface should have no deviation from flatness and no surface roughness and the contact pressure should be high, the contact heat resistance would be very small. However, it does not happen in reality that there is no deviation from flatness or no surface roughness, so the MPU 3 and the contact surface 131 would have gaps therebetween but for the heat conducting member therebetween. Since air has a high adiabatic effect, the contact heat resistance will be high if there are gaps between the MPU 3 and the contact surface 131. According to the present preferred embodiment, since the heat conducting member is interposed between the MPU 3 and the contact surface 131 as described above, the value of the contact heat resistance can be small.

A highly heat-conductive material is used for the heat conducting member. In the present preferred embodiment, in consideration of workability, a tape-like member such as a coated thermal tape made of a support base of polyimide film or aluminum foil or the like coated with a pressure-sensitive adhesive containing a filling agent is used. The more widely the heat conducting member and the surface of the MPU 3 or the contact surface 131 contact each other, the lower the contact heat resistance. Therefore, with a silicon oil used as a base oil, a greasy heat-conductive silicone resin or the like into which highly heat-conductive powders of alumina or the like are mixed may be used as the material of the heat conducting member. Since a thermal tape is used as cut into a predetermined size, the area of the surface of the MPU 3 and the contact surface 131 might not be used effectively. As the heat-conductive silicone resin is greasy, it can have an airtight contact with the surface of each of these components with vertically no gaps. Hence, the area of the surface of the MPU 3 and the contact surface 131 can be used effectively. Any other material can be alternatively used as the heat conducting member as long as such a material has a high heat conductance, and the shape and quality of such a material are no object.

Heat generated by the MPU 3 is conducted to the base 11 of the heat sink 1 through the heat conducting member. In this conducting process, it is possible to significantly improve the radiation efficiency by reducing the heat resistance. Here, the value of the contact heat resistance that occurs between the MPU 3 and the heat conducting member and between the heat conducting member and the contact surface 131 is critical. The value of the contact heat resistance is determined by contact pressure, contact wideness, surface roughness of the contact surface, heat conductance of each component, heat conductance of the heat conducting member, thickness of the heat conducting member, and hardness of the surface of each component. The surface of the MPU 3 is generally made of a highly heat-conductive copper plate called heat spreader. Therefore, it is necessary to find out a method for reducing the value of the contact heat resistance, on the condition that as for the MPU 3, specific values are pre-given as the contact wideness, the surface roughness, the material (copper plate) heat conductance, and the material (copper plate) hardness. Further, since an aluminum alloy is used for the contact surface 131 of the heat sink 1 as described above, it is necessary to devise a method for reducing the value of the contact heat resistance, on the condition that specific values are pre-given as the surface roughness of the contact surface, the material (copper) heat conductance, and the material (copper) hardness. It is well known that the value of a contact heat resistance can be reduced by increasing the contact pressure.

Figure 11:
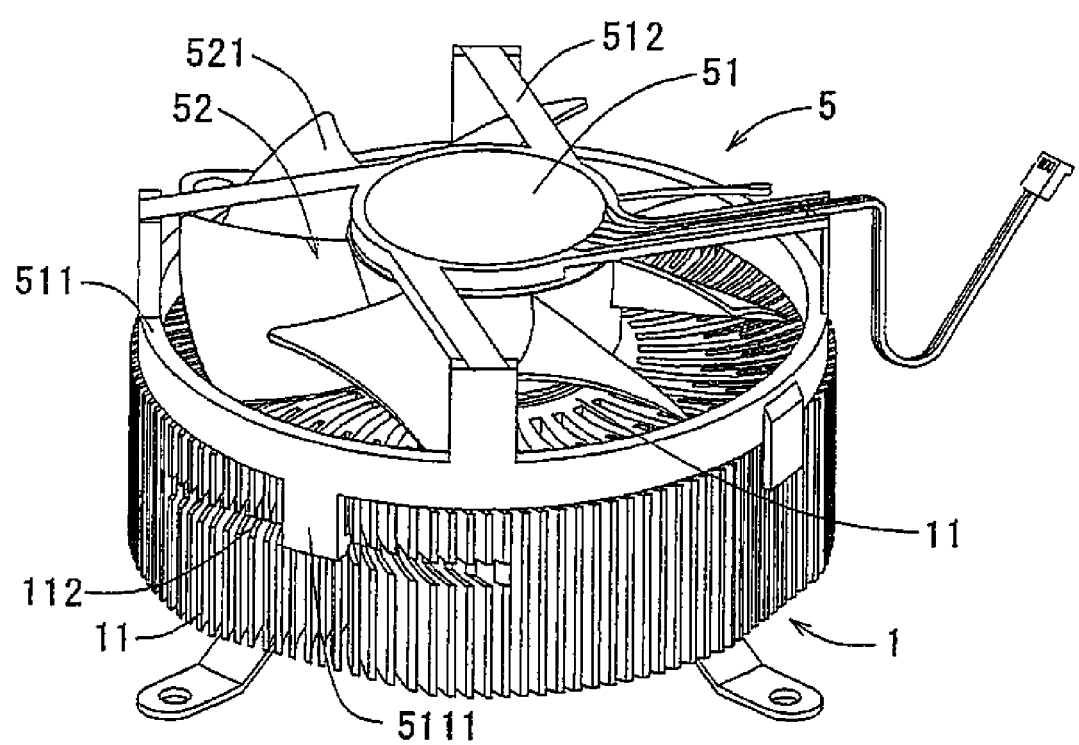
FIG. 11 is a perspective diagram showing a heat sink fan formed of the heat sink and a cooling fan attached on the top of the heat sink.

FIG. 11 is a perspective diagram showing a heat sink fan assembled by attaching a cooling fan on the top of the heat sink 1. The cooling fan 5 is attached on the opposite surface of the columnar base 11 to the contact surface 131. Heat is conducted from the MPU 3 through the heat conducting member to the base 11. Then, the heat conducted to the base 11 is conducted to the radiating fins 12. According to the present preferred embodiment, the cooling fan 5 acts on the heat sink 1 to supply cooling air to the radiating fins 12, and the heat conducted to the radiating fins 12 is forcibly radiated. The structure of the cooling fan 5 will be explained below.

The cooling fan 5 has an impeller 52 which rotates to generate cooling air, an electric motor (not shown) for driving the impeller 52 to rotate, an air tunnel 511 which converts the cooling air generated by the rotation of the impeller 52 into static pressure energy, a base 51 to which the electric motor is fixed, and at least three or more spokes 512 that link the base 51 to the air tunnel 511.

The impeller 52 has a plurality of blades 521. The blades 521 are formed to protrude outward in the diameter direction with the center of the blades 521 positioned at the rotation axis of the impeller 52. With the rotation of the impeller 52, the blades 521 give motion energy to the air. With the rotation of the impeller 52, air suction occurs in the axial direction, and air discharge occurs in the axial direction. That is, rotation of the impeller 52 generates air flows in the axial direction. Since the air flows are generated by the rotation of the impeller 52, the air flows include three kinds of components, namely distally-directed components which head outward in the diameter direction, circling components which flow in the rotational direction, and axially-directed components which are to be discharged in the axial direction. When considering the flow velocity component of the air flows, the highest flow velocity occurs in the outward flow in the diameter direction of the impeller 52, and the lowest flow velocity occurs in the inward flow in the diameter direction of the impeller 52. Accordingly, the cooling air that is supplied to the heat sink 1 is the fastest in the outward direction in the diameter direction of the radiating fins 12.

As shown in FIG. 11, the cooling fan 5 is put on the top of the heat sink 1 such that the center axis of the base 11 and the rotation axis of the impeller 52 of the cooling fan 5 vertically meet each other. The heat sink 1 has a groove 112 in the outer circumferential surface thereof, i.e., in the edge of the radiating fins 12, as shown in FIG. 11. An arm 5111 that extends downward from the air tunnel 511 locks in the groove 112 and fixes the heat sink 1 and the cooling fan 5 together. Heat generated by the MPU 3 is conducted to the base 11 through the heat conducting member. Then, the heat is conducted from the base 11 to the radiating fins 12. By the rotation of the cooling fan 5, cooling air is supplied from the top downward in FIG. 11. The radiating fins 12 are aligned with the rotational direction of the impeller 52. Thus, the cooling air is effectively let in between the radiating fins 12, and heat conducted to the radiating fins 12 is forcibly radiated. With the combination of the heat sink 1 and the cooling fan 5, the cooling performance of the heat sink 1 will further be improved.

The radiating fins 12 are curved in the direction opposite to the rotational direction of the impeller 52. This prevents different air flows generated by the blades 521 with the rotation of the impeller 52 from interfering with the same radiating fin 12. Hence, noise caused by interference of the air flows with the radiating fins 12 can be reduced. However, though the radiating fins 12 are actually curved to the opposite direction to the rotational direction of the impeller 52, they could just be tilted not curved to exert sufficient prevention against interference with the air flows. The blades 521 of the impeller 52 themselves are curved in the rotational direction. Thus, the radiating fins 12 need not even be tilted but only to extend in the radial direction in order to reduce interference with the air flows.

Next, another heat sink fan according to the present preferred embodiment will be explained. The heat sink fan of the present example is the same as the heat sink fan shown in FIG. 1 to FIG. 3 and FIG. 9 to FIG. 12, except the fixation of the attaching member 9.

Figure 12:
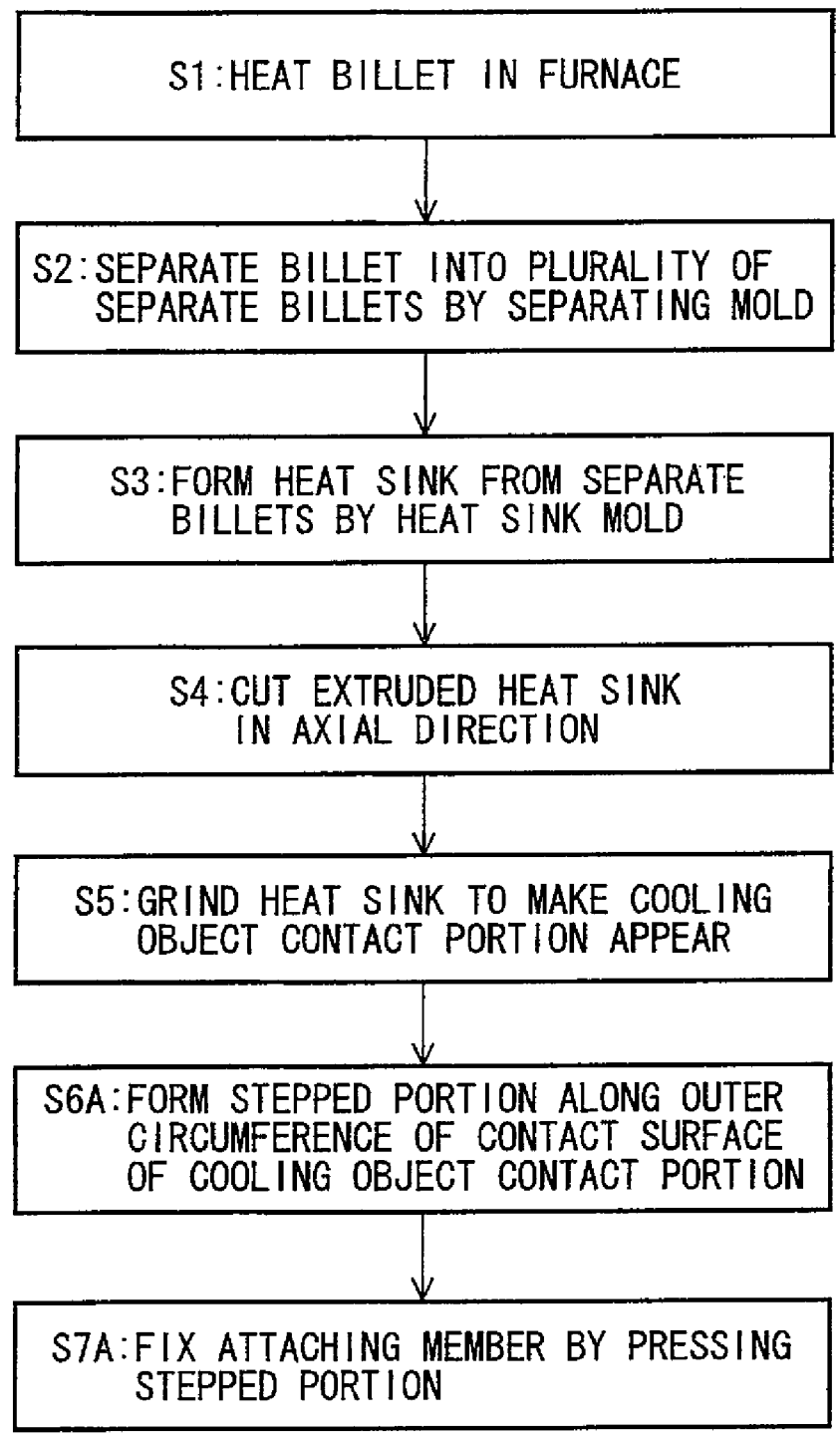
FIG. 12 is a diagram showing a flow up to completion of another heat sink.
Figure 13:
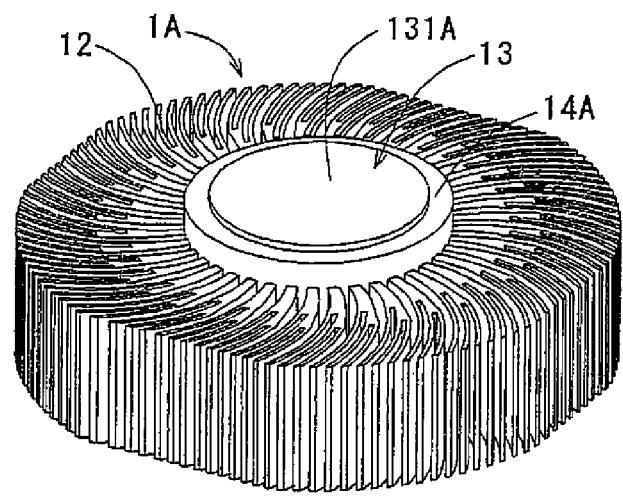
FIG. 13 is a perspective diagram showing a process included in a step of grinding a cooling object contact portion of another heat sink.

FIG. 12 is a diagram showing the flow through which another heat sink according to the present preferred embodiment is formed. FIG. 13 is a perspective diagram showing a given process included in the step of grinding a cooling object contact portion of another heat sink according to the present preferred embodiment.

As shown in FIG. 12, the formation of the heat sink goes completely the same up to step S5. Hence, step 5 and the steps after step 5 will be explained.

The heat sink 1A has the radiating fins 12 ground down by a lathe such that a generally cylindrical cooling object contact portion 13 projects from the end surface of the heat sink 1A in the axial direction (step S5). Next, as a grinding process by a lathe, a stepped portion 14A is ground out along the outer circumference of the end surface of the cooling object contact portion 13 (the end surface being a surface to be brought into contact with an MPU 3; a contact surface 131A) such that the stepped portion 14A is dropped toward the heat sink 1A, as shown in FIG. 13 (step S6A). A region internal to the stepped portion 14A, i.e., a contact surface 131A is formed to protrude from the stepped portion 14A upward in the axial direction in FIG. 13. This contact surface 131A is the region to have contact with a cooling object (MPU 3).

Figure 15:
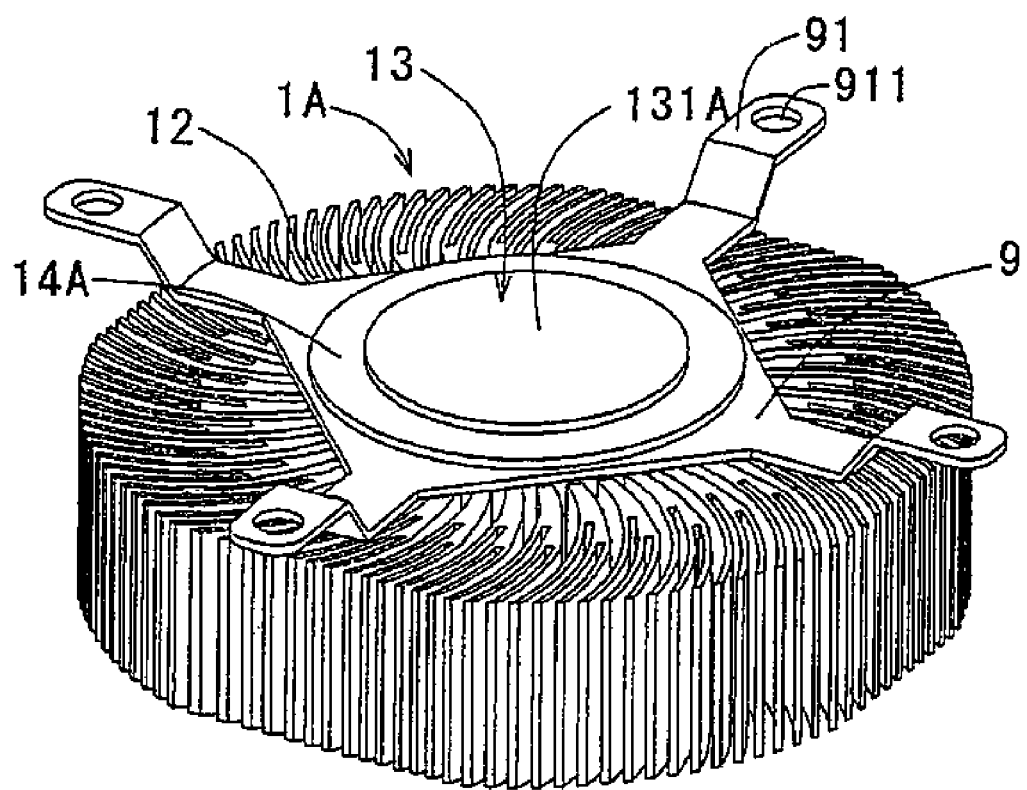
FIG. 15 is a perspective diagram showing the heat sink on which the attaching member is fixed.

FIG. 13 is a perspective diagram showing how an attaching member is fixed on another heat sink according to the present preferred embodiment. FIG. 15 is a perspective diagram showing another heat sink on which the attaching member is fixed. The heat sink 1A of the present example is used for cooling an MPU 3. Hence, its contact surface 131A has to contact the MPU 3. Therefore, the heat sink 1A has to be attached on the motherboard 31 on which the MPU 3 is mounted. Hence, the attaching member 9 for attaching the heat sink 1A to the motherboard 31 is attached to the heat sink 1A. The attaching member 9 has a through hold 92 at the center, and four attaching legs 91 that extend outward in the diameter direction, as shown in FIG. 9. A through hole 911 is formed in the tip of the attaching legs 91, into which a fixing member 90 for fastening the motherboard 31 and the attaching member 9 together is to be inserted. A stainless material having a high rust preventing property such as SUS, etc. is used for the attaching member 9.

Figure 14:
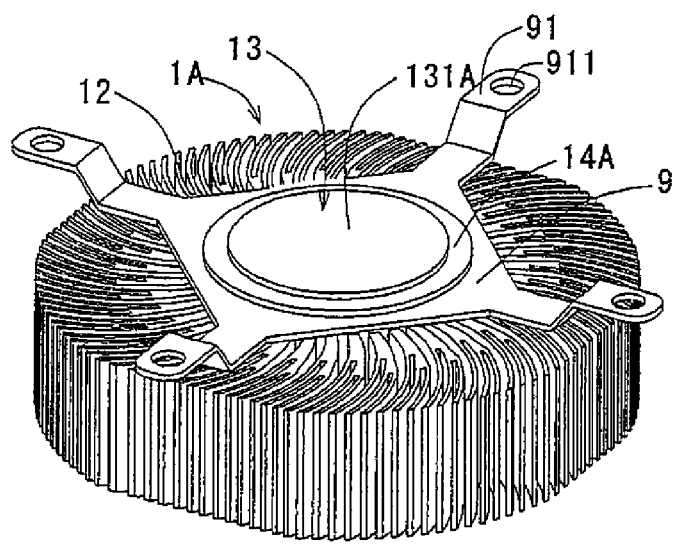
FIG. 14 is a perspective diagram showing another heat sink on which an attaching member is fixed.

First, the attaching member 9 is attached such that the through hole formed at the center of the attaching member 9 is fitted on the outer circumferential surface of the cooling object contact portion 13, as shown in FIG. 14. When attaching the attaching member 9 to the cooling object contact portion 13, it is pressed until it abuts on the end surface of the radiating fins 12. In this state, the stepped potion 14A has its entire region pressed downward in the axial direction in FIG. 14 by a pressing machine (step S7A). The pressed stepped portion 14A is plastically deformed outward in the diameter direction of the cooling object contact portion 13. As shown in FIG. 15, the attaching member 9 is fixed between the plastically deformed stepped portion 14A and the end surface of the radiating fins 12. Since the stepped portion 14A is plastically deformed, its shape is kept as thusly deformed. Hence, the attaching member 9 is kept as fixed on the cooling object contact portion 13. Further, with the pressurization, the outer frame of the cooling object contact portion 13 is deformed such that the diameter elongates outward in the diameter direction. Hence, with the pressure given by the outer frame of the cooling object contact portion 13 on the through hole 92 of the attaching member 9, the attaching member 9 is fixed on the outer circumferential surface of the cooling object contact portion 13.

In order for the cooling performance of the heat sinks 1 and 1A to be stabilized, it is necessary that the contact area of the contact surfaces 131 and 131A be uniform among the products manufactured in mass production. In the first example, the region internal to the annular groove 14 is the contact surface 131. In this case, the pressure application portion 15 is pressurized and plastically deformed, but the deformation does not expand to the contact surface 131. In the second example, the region internal to the stepped portion 14A is the contact surface 131A. In this case, the stepped portion 14A is pressurized and plastically deformed, but the deformation does not expand to the contact surface 131A. Hence, in the first and second examples both, the area of the contact surfaces 131 and 131A can be made uniform, and stabilization of the cooling performance of the heat sinks 1 and 1A can be obtained.

As another modification, a pressure may be applied to the outer circumferential region of the cooling object contact portion 13 with no annular groove 14 or stepped portion 14A formed, to fix the attaching member 9 on the outer circumferential surface of the cooling object contact portion 13, and the top surface of the cooling object contact portion 13 may be ground to form the contact surface 131.

Figure 16:
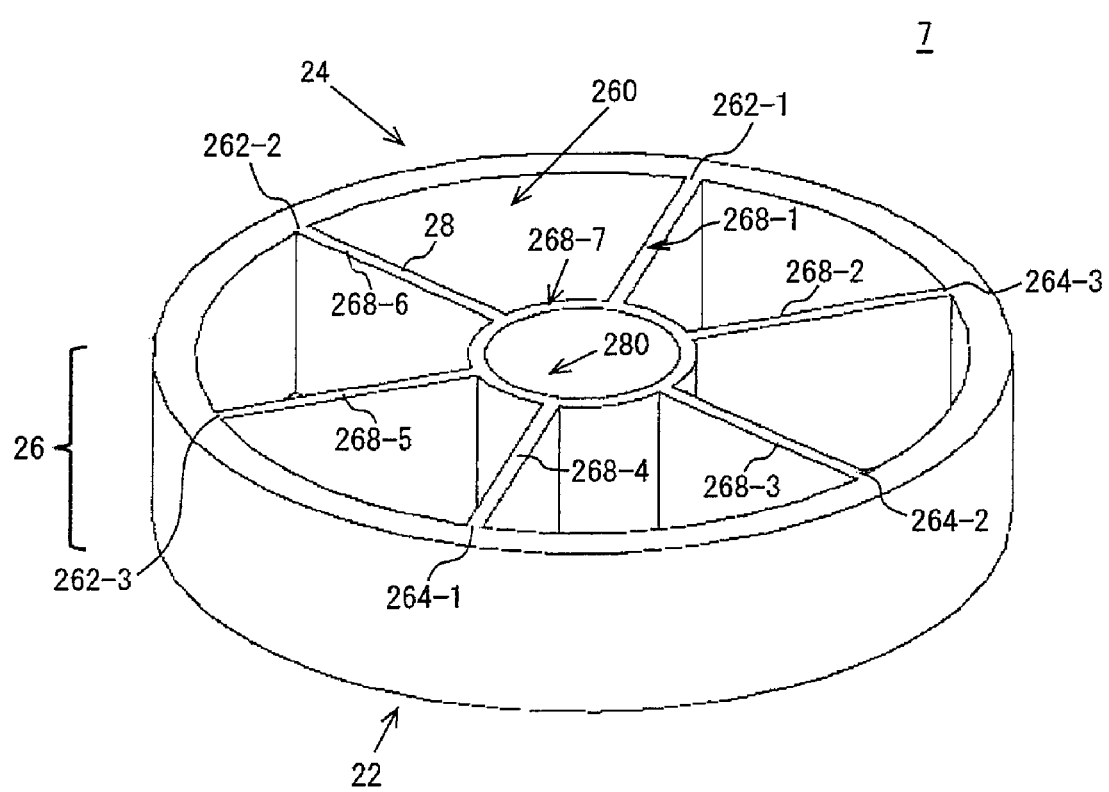
FIG. 16 is a diagram for explaining the detail of a separating die 7.
Figure 17:
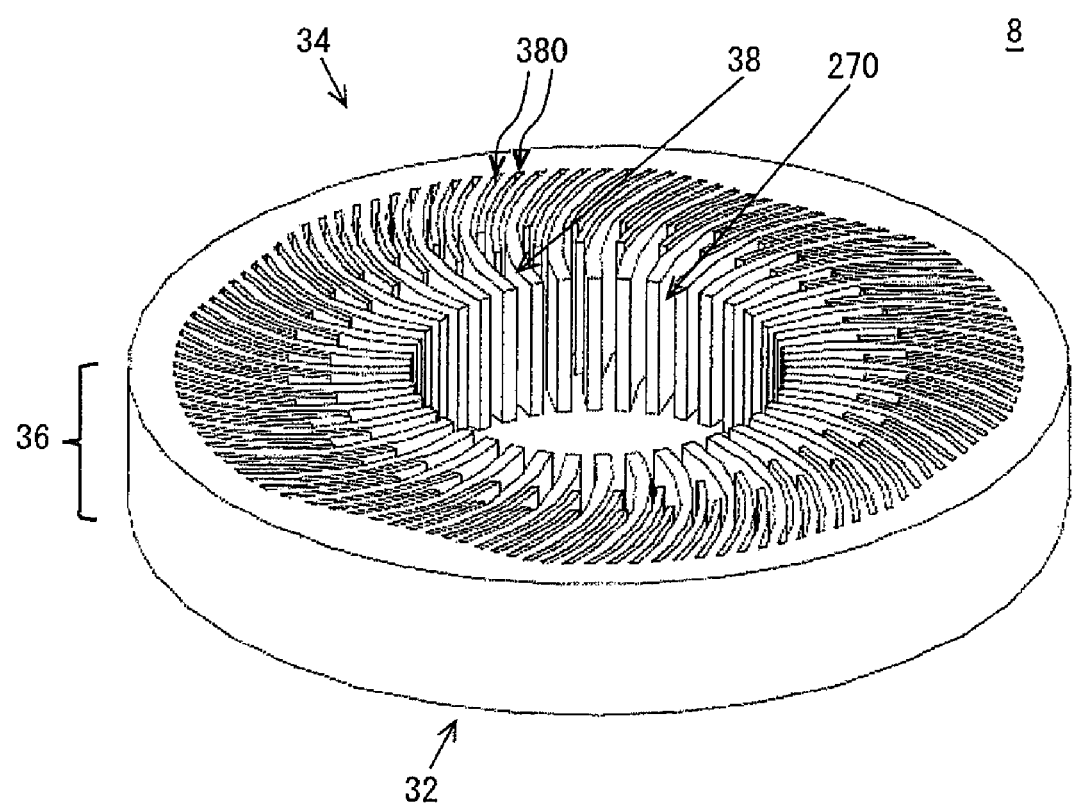
FIG. 17 is a diagram for explaining the detail of a heat sink die.

FIG. 16 shows the detail of the separating die 7 used for forming the heat sink according to the present preferred embodiment. FIG. 17 shows the detail of the heat sink die 8 used for forming the heat sink according to the present preferred embodiment. The separating die 7 is one example of a second die and the heat sink die 8 is one example of a first die.

The separating die 7 of the present example is formed of a cylindrical metal, and has two openings 22 and 24, a material passing portion 26, and a separator 28. The opening 22 receives the material, which is to be discharged from the opening 24. In the present example, both the ends of the cylindrical separating die 7 are the openings 22 and 24 respectively, and the openings 22 and 24 have generally the same shape as each other. The material is extruded from the opening 22 toward the opening 24 by the direct method explained above.

The material passing portion 26 is formed between the opening 22 and the opening 24, and has an inner wall 260. The material passing portion 26 of the present example is the tubular portion of the cylindrical separating die 7. The material passing portion 26 of the present example is a cylinder having a diameter that is not varied in the direction of the longer dimension. The inner wall 260 is the internal surface of the cylindrical separating die 7.

The separator 28 of the present example has a plurality of plate-like members 268-1 to 268-6 which extend in the direction of the axis of the cylinder, and a tubular member 268-7 which extends in the direction of the axis of the cylinder. The tubular member 268-7 has a smaller diameter than that of the cylindrical separating die 7, and is disposed inside the separating die 7 such that the axis of the separating die 7 and the axis of the tubular member 268-7 generally coincide with each other. The plurality of plate-like members 268-1 to 268-6 are formed integrally with the tubular member 268-7 along the center axis of the tubular member 268-7. In this case, the plurality of plate-like members 268-1 to 268-6 are disposed generally radially from the center axis of the tubular member 268-7 generally equiangularly.

One end of the plate-like member 268-1 is joined to a portion 262-1 of the inner wall, and the other end of the plate-like member 268-1 is joined to the tubular member 268-7. Further, one end of the plate-like member 268-4 is joined to another portion 264-1 of the inner wall, and the other end of the plate-like member 268-4 is joined to the tubular member 268-7. This allows the separator 28 to link the portion 262-1 of the inner wall of the material passing portion 26 to the another portion 264-1 of the inner wall. Likewise, the plate-like members 268-6 and 268-3 and plate-like members 268-5 and 268-2 of the separator 28 link portions 262-2 and 262-3 of the inner wall to their another portions 264-2 and 264-3 of the inner wall via the tubular member 268-7.

The material which passes through the material passing portion 26 and separator 28 having the above-described structure is separated into the separate materials 61 and 62 explained with reference to FIG. 3, and extruded from the opening 24.

Figure 18:
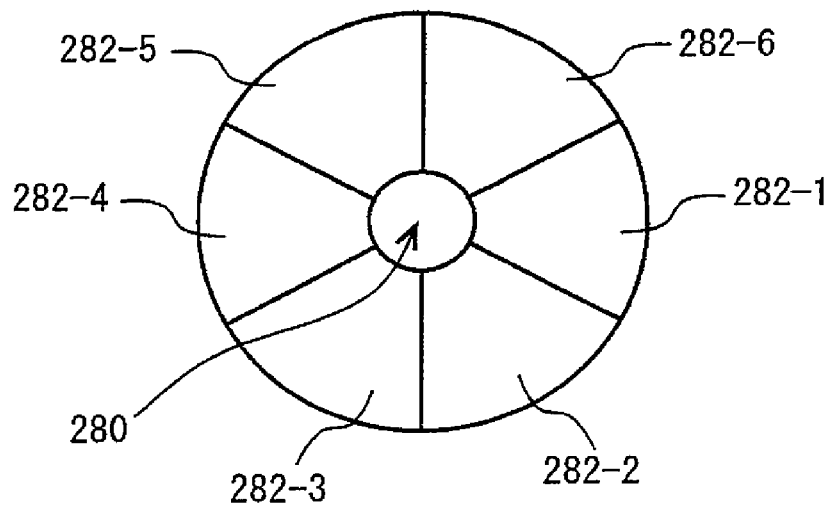
FIG. 18 is a diagram showing the shape of a separator of the heat sink die.

FIG. 18 shows the shape of the separator 28. When the second opening 24 of the separating mold 7 of the present example is seen from the direction in which the material is extruded or drawn, the inner wall 260 of the first material passing portion 26 and the separator 28 form a plurality of generally symmetric holes 280 and 282. The separator 28 has the hole 280 which is generally circular, and the plurality of holes 282-1 to 282-6 which are generally fan-shaped, disposed to surround the circular hole 280. In the present example, the generally fan-shaped holes 282-1 to 282-6 have a shape of at least one portion of a fan having an inner angle of about 60 degrees. The material that has passed through the hole 280 forms the separate material 61, and the material that has passed through the holes 282 forms the separate materials 62.

The heat sink die 8 of the present example is formed of a cylindrical metal, and is positioned adjacent the separating die 7. The heat sink die 8 has two openings 32 and 34, a material passing portion 36, and a plurality of fin forming grooves 38. In the present example, both the ends of the cylindrical heat sink die 8 are the openings 32 and 34 respectively, and the openings 32 and 34 have generally the same shape as each other. The third opening 32 receives the separate materials 61 and 62 obtained by separation by the separating die 7.

The material passing portion 36 is formed between the openings 32 and 34, and has an inner wall 270. The material passing portion 36 of the present example is the tubular portion of the cylindrical heat sink die 8. The material passing portion 36 of the present example is a cylinder having a diameter which is not varied in the direction of the longer dimension. The inner wall 270 is the internal surface of the cylindrical heat sink die 8. The plurality of fin forming grooves 38 are formed in at least one region of the inner wall 270.

When the opening 34 is seen from the direction in which the material is extruded (or drawn), the fin forming grooves 38 of the present example are arranged along the circumference of the opening 34 centered by the center axis that penetrates generally the center of the opening 34. In this case, the plurality of fin forming grooves 38 each extend in the direction that heads from the opening 32 to the opening 34, and are disposed on the circumference of the inner wall 270 of the material passing portion 36 generally at regular intervals. Each of the plurality of fin forming grooves 38 of the present example has a plurality of narrow grooves 380, and these grooves have generally the same depth and shape with each other in the direction heading from the opening 32 to the opening 34. The plurality of fin forming grooves 38 of the present example and their internal narrow grooves 380 are formed to curve in the direction of their arrangement, but their shape may be arbitrarily changed. For example, the plurality of fin forming grooves 38 may be shaped to extend radially outward from the center of the opening 34.

The separate materials 61 and 62 that pass through the material passing portion 36 are discharged from the opening 34. Thus, the separate material 61 that has passed through the material passing portion 36 forms the base 11, and the separate materials 62 that have passed through the plurality of fin forming grooves 38 form the plurality of radiating fins 12. In this manner, the heat sink 2, which has the center material 610 and radiating fin materials 620 at the base 11, and which has the plurality of radiating fins 12 and one end of the radiating fin materials 620 formed integrally, is formed.

Figure 19:
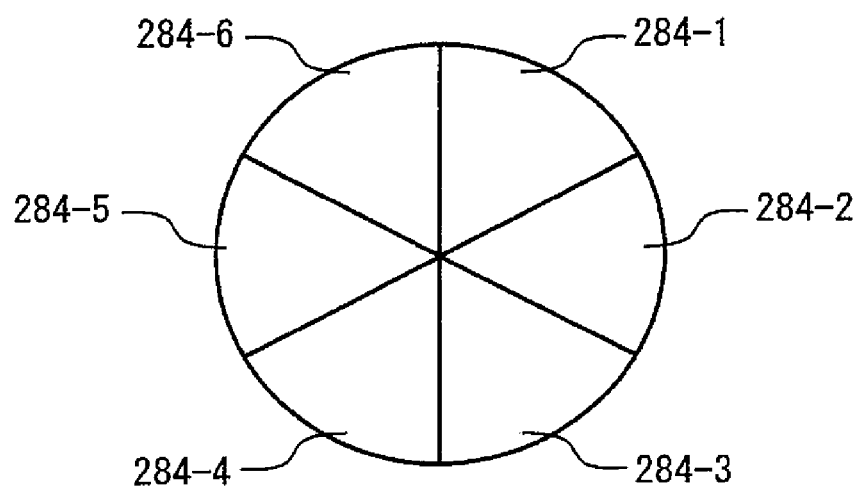
FIG. 19 is a diagram showing another example of the separator.
Figure 20:
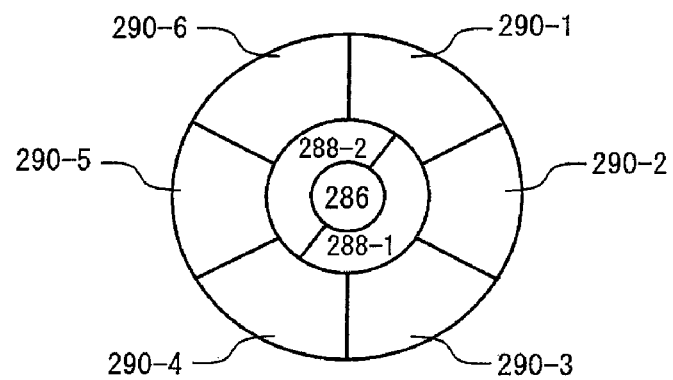
FIG. 20 is a diagram showing yet another example of the separator.
Figure 21:
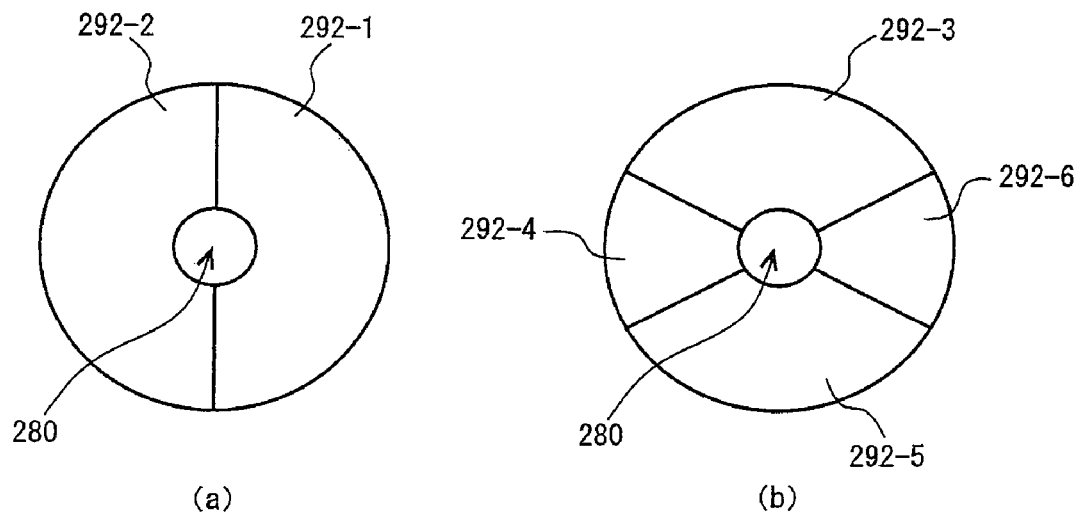
FIGS. 21($a$) and 21($b$) are diagrams for explaining an example where a plurality of separating dies are used.

In the present example, the separator 28 has the circular hole 280 as a generally symmetric hole, but the generally symmetric hole is not limited to a circular hole as in the present example, Here, a symmetric shape may be a shape symmetric with respect to a point or a shape symmetric with respect to a line, and may be, for example, an equilateral triangle, a square, a rectangle, a rhombus, an ellipse, and a regular polygon. In the present example, the plurality of holes 282-1 to 282-6 that are disposed to surround the circular hole 280 has a shape of a portion of a fan, but this shape may also be arbitrarily changed. For example, as shown in FIG. 19, the separator 28 may have no circular hole 280, but only a plurality of holes 284-1 to 284-6 which are disposed generally symmetrically. Alternatively, as shown in FIG. 20, the separator 28 may have a plurality of concentric-circular holes 286 and 288, and a plurality of holes 290-1 to 290-6 which surround these holes. The number and shape of the holes provided to the separator 28 may arbitrarily be changed in a manner that the metal flows of the respective separate members to be extruded are uniform in the fin forming grooves 38 of the heat sink die 8.

Further, the separating die 7 may be formed of a plurality of dies. The separating die shown in FIG. 21(*a*) has a hole 280 at the center, and semicircular holes 292-1 and 292-2 disposed around the hole 280. The separating die shown in FIG. 21 (*b*) has a hole 280 at the center, and fan-shaped holes 292-3 to 292-6 disposed around the hole 280. In these examples, the center holes provided to both of these separating dies are holes of the same shape. The material may first be separated into three separate materials by the separating die shown in FIG. 21(*a*), and then extruded from the separating die shown in FIG. 21(*b*). It becomes possible to efficiently form separate materials having more complex shapes, by, for example, firstly separating the material into relatively-large materials by the initial separating die, and then separating the materials further into smaller materials by the next separating die.

The separating die 7 and heat sink die 8 of the present example are formed independently, but they may be formed integrally as one die. Further, the separating die 7 and heat sink die 8 of the present example are both cylindrical, but their shape is not limited to this. For example, the openings 22 and 24 of the separating die 7 may be differently sized. Further, the material passing portion 26 may have such a cylindrical shape that gradually changes its diameter from the opening 22 toward the opening 24. Alternatively, the separating die 7 may have a tubular shape whose openings 22 and 24 have a generally symmetric shape. As for the heat sink die 8 too, the openings 32 and 34 and the material passing portion 36 may be arbitrarily changed.

Although some aspects of the present invention have been described by way of exemplary embodiment, the technical scope of the present invention is not limited to the above-described preferred embodiment. It is obvious to those skilled in the art that many changes and substitutions can be made upon the above-described preferred embodiment. It is apparent from the appended claims that any embodiments upon which such changes and substitutions are made are included in the technical scope of the present invention.

As obvious from the above, according to the preferred embodiment of the present invention, it is possible to provide a heat sink and a manufacturing method thereof, which are excellent in procurement, cost, reliability, and productivity. Further, a heat sink can be firmly attached to an MPU.

What is claimed is:

1. A manufacturing method of a radiator for cooling an object, comprising:
   (a) heating a material;
   (a-2) separating the material into a plurality of columnar pieces by extruding the material from a separating die;
   (b) extruding the plurality of columnar pieces obtained in the separating step from a forming die to combine at least two of the plurality of columnar pieces to obtain at least one solid and columnar member made of substantially only the material; and
   (c) cutting the solid and columnar member to form the radiator.

2. The manufacturing method of the radiator according to claim 1, wherein (a) further includes adjusting a temperature of the material to a predetermined temperature.

3. The manufacturing method of the radiator according to claim 1, further comprising adjusting a temperature of the plurality of columnar pieces obtained by the separating using the separating die.

4. The manufacturing method of the radiator according to claim 1, wherein (b) includes adjusting a temperature of the forming die.

5. The manufacturing method of the radiator according to claim 4, wherein the temperature of the forming die is adjusted to be higher than a temperature of the material in (a).

6. The manufacturing method of the radiator according to claim 1, wherein the separating the material into the plurality of columnar pieces using the separating die, includes adjusting a temperature of the separating die.

7. The manufacturing method of the radiator according to claim 6, wherein the temperature of the separating die is adjusted to be higher than a temperature of the material in (a).

8. The manufacturing method of the radiator according to claim 1, wherein (b) includes adjusting a speed at which the material is extruded.

9. The manufacturing method of the radiator according to claim 8, wherein the speed at which the material is extruded is determined based on at least one of a temperature, a composition, and a viscosity of the heated material.

10. The manufacturing method of the radiator according to claim 8, wherein the speed at which the material is extruded is determined based on at least one of a shape and a temperature of the forming die.

11. The manufacturing method of the radiator according to claim 1, wherein a speed at which the material is extruded is determined based on at least one of a shape and a temperature of the separating die.

12. The manufacturing method of the radiator according to claim 1, wherein before the material is fully extruded from the second die in (a-2), the plurality of columnar pieces obtained by the separating step using the separating die are subject to the extruding from the forming die.

13. The manufacturing method of the radiator according to claim 1, wherein after the material is fully extruded from the separating die in (a-2), the plurality of columnar pieces obtained by the separating step using the separating die is subject to the extruding from the forming die.

14. The manufacturing method of the radiator according to claim 13, wherein a speed at which the material is extruded from the separating die in (a-2) is different from a speed at which the plurality of columnar pieces obtained by the separating step using the separating die are extruded from the forming die in (b).

15. The manufacturing method of the radiator according to claim 1, wherein (a-2) includes further separating the plurality of columnar pieces extruded from the separating die, by extruding them from a second separating die.

16. A radiator manufactured by the manufacturing method of a radiator according to claim 1.

* * * * *